(12) United States Patent
Tucker

(10) Patent No.: US 6,898,752 B2
(45) Date of Patent: May 24, 2005

(54) APPARATUS AND METHODS FOR COMBINATIONAL ERROR DETECTION IN AN INFINIBAND SWITCH

(75) Inventor: S. Paul Tucker, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 537 days.

(21) Appl. No.: 10/161,503

(22) Filed: May 31, 2002

(65) Prior Publication Data
US 2003/0226085 A1 Dec. 4, 2003

(51) Int. Cl.⁷ .............................................. H03M 13/00
(52) U.S. Cl. ...................... 714/752; 714/776; 370/252; 370/360
(58) Field of Search ............................... 714/752, 776; 370/242, 235, 252, 360, 474

(56) References Cited

U.S. PATENT DOCUMENTS

| | | | | |
|---|---|---|---|---|
| 5,790,799 A | * | 8/1998 | Mogul | 709/224 |
| 6,424,632 B1 | * | 7/2002 | Poret et al. | 370/395.3 |
| 6,438,128 B1 | * | 8/2002 | Kashyap | 370/389 |
| 6,732,318 B2 | * | 5/2004 | Collier et al. | 714/758 |

* cited by examiner

Primary Examiner—Phung My Chung

(57) ABSTRACT

A combination error detector to detect errors in an InfiniBand packet. The detector includes registers that stores fields of an InfiniBand packet as the packet is being received and comparison logic that, as the fields are stored in the registers, compares the fields with check values and when an error is detected sets a flag corresponding to the error. After the packet has been completely received and all checks have been complete, all of the error flags are prioritized in accordance with the InfiniBand Architecture Specification.

11 Claims, 6 Drawing Sheets

APPARATUS AND METHODS FOR COMBINATIONAL ERROR DETECTION IN AN INFINIBAND SWITCH

BACKGROUND OF THE INVENTION

InfiniBand™ is an emerging bus technology that hopes to replace the current PCI bus standard, which only supports up to 133 Mbps (Megabits per second) transfers, with a broader standard that supports a maximum shared bandwidth of 566 Mbps. InfiniBand is the culmination of the combined efforts of about 80 members that are led by Intel, Compaq, Dell, Hewlett-Packard, IBM, Microsoft and Sun Systems who collectively call themselves the InfiniBand Trade Association. The InfiniBand Trade Association has published a specification entitled: Infiniband™ Architecture Specification Release 1.0. The Specification spans three volumes and is incorporated herein by reference.

The InfiniBand Architecture (referred to herein as "IBA") is a first order interconnect technology, independent of the host operating system (OS) and processor platform, for interconnecting processor nodes and I/O nodes to form a system area network. IBA is designed around a point-to-point, switched I/O fabric, whereby end node devices (which can range from very inexpensive I/O devices like single chip SCSI or Ethernet adapters to very complex host computers) are interconnected by cascaded switch devices. The physical properties of the IBA interconnect support two predominant environments:

i. Module-to-module, as typified by computer systems that support I/O module add-in slots
ii. Chassis-to-chassis, as typified by interconnecting computers, external storage systems, and external LAN/WAN access devices (such as switches, hubs, and routers) in a data-center environment.

IBA supports implementations as simple as a single computer system, and can be expanded to include: replication of components for increased system reliability, cascaded switched fabric components, additional I/O units for scalable I/O capacity and performance, additional host node computing elements for scalable computing, or any combinations thereof. IBA is scalable to enable computer systems to keep up with the ever-increasing customer requirement for increased scalability, increased bandwidth, decreased CPU utilization, high availability, high isolation, and support for Internet technology. Being designed as a first order network, IBA focuses on moving data in and out of a node's memory and is optimized for separate control and memory interfaces. This permits hardware to be closely coupled or even integrated with the node's memory complex, removing any performance barriers.

IBA uses reliable packet based communication where messages are enqueued for delivery between end nodes. IBA defines hardware transport protocols sufficient to support both reliable messaging (send/receive) and memory manipulation semantics (e.g. remote DMA) without software intervention in the data movement path. IBA defines protection and error detection mechanisms that permit IBA transactions to originate and terminate from either privileged kernel mode (to support legacy I/O and communication needs) or user space (to support emerging interprocess communication demands).

IBA can support bandwidths that are anticipated to remain an order of magnitude greater than current I/O media (SCSI, Fiber Channel, and Ethernet). This enables IBA to act as a common interconnect for attaching I/O media using these technologies. To further ensure compatibility across varying technologies, IBA uses IPv6 headers, supporting extremely efficient junctions between IBA fabrics and traditional Internet and Intranet infrastructures.

FIG. 1 is a block diagram of the InfiniBand architecture layers 100. IBA operation can be described as a series of layers 100. The protocol of each layer is independent of the other layers. Each layer is dependent on the service of the layer below it and provides service to the layer above it.

The physical layer 102 specifies how bits are placed on a wire to form symbols and defines the symbols used for framing (i.e., start of packet & end of packet), data symbols, and fill between packets (Idles). It specifies the signaling protocol as to what constitutes a validly formed packet (i.e., symbol encoding, proper alignment of framing symbols, no invalid or non-data symbols between start and end delimiters, no disparity errors, synchronization method, etc.).

The link layer 104 describes the packet format and protocols for packet operation, e.g. flow control and how packets are routed within a subnet between the source and destination. There are two types of packets: link management packets and data packets.

Link management packets are used to train and maintain link operation. These packets are created and consumed within the link layer 104 and are not subject to flow control. Link management packets are used to negotiate operational parameters between the ports at each end of the link such as bit rate, link width, etc. They are also used to convey flow control credits and maintain link integrity.

Data packets convey IBA operations and can include a number of different headers. For example, the Local Route Header (LRH) is always present and it identifies the local source and local destination ports where switches will route the packet and also specifies the Service Level (SL) and Virtual Lane (VL) on which the packet travels. The VL is changed as the packet traverses the subnet but the other fields remain unchanged. The Global Route Header (GRH) is present in a packet that traverses multiple subnets. The GRH identifies the source and destination ports using a port's Global ID (GID) in the format of an IPv6 address.

There are two CRCs in each packet. The Invariant CRC (ICRC) covers all fields which should not change as the packet traverses the fabric. The Variant CRC (VCRC) covers all of the fields of the packet. The combination of the two CRCs allow switches and routers to modify appropriate fields and still maintain an end to end data integrity for the transport control and data portion of the packet. The coverage of the ICRC is different depending on whether the packet is routed to another subnet (i.e. contains a global route header).

The network layer 106 describes the protocol for routing a packet between subnets. Each subnet has a unique subnet ID, the Subnet Prefix. When combined with a Port GUID, this combination becomes a port's Global ID (GID). The source places the GID of the destination in the GRH and the LID of the router in the LRH. Each router forwards the packet through the next subnet to another router until the packet reaches the target subnet. Routers forward the packet based on the content of the GRH. As the packet traverses different subnets, the routers modify the content of the GRH and replace the LRH. The last router replaces the LRH using the LID of the destination. The source and destination GIDs do not change and are protected by the ICRC field. Routers recalculate the VCRC but not the ICRC. This preserves end to end transport integrity.

While, the network layer 106 and the link layer 104 deliver a packet to the desired destination, the transport layer 108 is responsible for delivering the packet to the proper queue pair and instructing the queue pair how to process the packet's data. The transport layer 108 is responsible for segmenting an operation into multiple packets when the message's data payload is greater than the maximum transfer unit (MTU) of the path. The queue pair on the receiving end reassembles the data into the specified data buffer in its memory.

IBA supports any number of upper layers 110 that provide protocols to be used by various user consumers. IBA also defines messages and protocols for certain management functions. These management protocols are separated into Subnet Management and Subnet Services.

FIG. 2 is a block diagram of an InfiniBand subnet 200. An IBA subnet 200 is composed of endnodes 202, switches 204, a subnet manager 206 and, possibly one or more router(s) 208. Endnodes 202 may be any one of a processor node, an I/O node, and/or a router (such as the router 208). Switches 202 are the fundamental routing component for intra-subnet communication. The switches 202 interconnect endnodes 202 by relaying packets between the endnodes 202. Routers 208 are the fundamental component for inter-subnet communication. Router 208 interconnects subnets by relaying packets between the subnets.

Switches 204 are transparent to the endnodes 202, meaning they are not directly addressed (except for management operations). Instead, packets transverse the switches 204 virtually unchanged. To this end, every destination within the subnet 200 is configured with one or more unique local identifiers (LID). From the point of view of a switch 204, a LID represents a path through the switch. Packets contain a destination address that specifies the LID of the destination. Each switch 204 is configured with forwarding tables (not shown) that dictate the path a packet will take through the switch 204 based on a LID of the packet. Individual packets are forwarded within a switch 204 to an out-bound port or ports based on the packet's Destination LID and the Switch's 204 forwarding table. IBA switches support unicast forwarding (delivery of a single packet to a single location) and may support multicast forwarding (delivery of a single packet to multiple destinations).

The subnet manager 206 configures the switches 204 by loading the forwarding tables into each switch 204. To maximize availability, multiple paths between endnodes may be deployed within the switch fabric. If multiple paths are available between switches 204, the subnet manager 206 can use these paths for redundancy or for destination LID based load sharing. Where multiple paths exists, the subnet manager 206 can re-route packets around failed links by re-loading the forwarding tables of switches in the affected area of the fabric.

FIG. 3 is a block diagram of an InfiniBand Switch 300. IBA switches, such as the switch 300, simply pass packets along based on the destination address in the packet's LRH. IBA switches do not generate or consume packets (except for management packets). Referring to FIG. 1, IBA switches interconnect the link layers 104 by relaying packets between the link layers 104.

In operation the switch 300 exposes two or more ports 302a, 302b ... 302n, between which packets are relayed. Each port 302n communicates with a packet relay 304 via a set of virtual lanes 306a though 306n. The packet relay 304 (sometimes referred to as a "hub or "crossbar") redirects the packet to another port 302, via that port's associated with virtual lanes 306, for transmission based on the forwarding table associated with the packet relay 304.

During operation a 32-bit word arrives into an InfiniBand virtual link 306 at a port 302 of a switch 300 every clock cycle. To maximize bandwidth and minimize switch latency, it is desirable to be able to transfer data through the switch packet relay at the same frequency. In an 8 port switch, it is desirable to provide at least 3 output ports to the packet relay.

As noted above, IBA uses packets as the main unit of communication. An IBA data packet conforms to the format shown in TABLE 1.

TABLE 1

| Word/Bits | 31–24 | 32–16 | | 15–8 | 7–0 | Notes |
|---|---|---|---|---|---|---|
| 0 | VL  LVER | SL  rsv | LNH | DLID | | LRH |
| 1 | resv 5 | PktLen (11 bits) | | SLID | | GRH |
| 2 | IPVers | Traffic Class | | Flow Label | | |
| 3 | | Payload Length | | Next Hdr | Hop Limit | |
| 4 | | GRH Body | | | | |
| 11 | | | | | | |
| 12 | OpCode | S  r  Pa | TVER | PKey | | BTH |
| 13 | resv (variant | | Destination QP | | | |
| 14 | resv 8 | | PSN | | | |
| ... | | | | | | Other Headers |
| n−1 | | | | | | EOP PYLD |
| n | | | IRC | | | |
| n+1 | | VRC | | | | |

As packets pass through the switch 300 they must be checked for errors, this process is typically termed error detection. To perform such error detection the Link Next Header (LNH) field of the packet must be decoded. The LNH field conforms to the format shown in Table 2.

TABLE 2

| LNH | | Packet Type | Transport | Next Header |
|---|---|---|---|---|
| 1 | 1 | IBA Global | IBA | GRH |
| 1 | 0 | IBA Local | IBA | BTH |
| 0 | 1 | IP - Non-IBA | Raw | GRH |
| 0 | 0 | Raw | Raw | RWH (Ethertype) |

The IBA specification discloses and recommends the use of a state machine to perform a multi-step packet error check. The checks are ordered with no consideration as to the order of the incoming packet data, but instead by their precedence. Fields VL, LVer, LNH, DLID, PktLen, IPVers, TVER, ICRC and VCRC are extracted, stored and analyzed by the state machine. This implies that a packet must be fully received, and hence stored, prior to performing error detection.

FIG. 4 is a flow chart of the operation of a data packet check machine as described in the IBA specification. The data packet check machine resides in each port 302 and determines whether a data packet is valid and should be forwarded from the port 302 to the packet relay 304. The method starts in step 400. Subsequently, a series of checks 402 through 414 are made to validate the packet. The order of the states in FIG. 4 does not necessarily represent the chronological order of the checks, but does represent the priority of the error classes. According to the InfiniBand specification, only one error is logged per packet in step 418. This state ordering determines which one, if any, is logged. If the packet satisfies all of the checks (e.g. states) the packet is forwarded to the packet relay 304 in step 416.

FIG. 5 is a flow chart of the operation of a link packet check machine as described in the IBA specification. The Link Packet Check Machine resides in each port and determines whether a link packet meets the rules of the InfiniBand specification, and thus whether or not the link packet should be interrogated for flow control or other information. The method starts in step 500. Subsequently a series of checks 502 through 508 are made to validate the link header. The order of the states in FIG. 5 does not necessarily represent the chronological order of the checks, but does represent the priority of the error classes. According to the InfiniBand specification, only one error is logged per packet in step 512. This state ordering determines which one, if any, is logged. If the packet satisfies all of the checks (e.g. states) the packet is forwarded to flow control circuitry (not shown) in step 416.

The Inventors of the present invention have recognized a need for methods and apparatus that enable error detection to be performed during reception of a packet, thereby eliminating the need to receive and store the entire packet prior to beginning such error detection.

BRIEF DESCRIPTION OF THE DRAWINGS

An understanding of the present invention can be gained from the following detailed description of the invention, taken in conjunction with the accompanying drawings of which.

DETAILED DESCRIPTION

Figure 1:
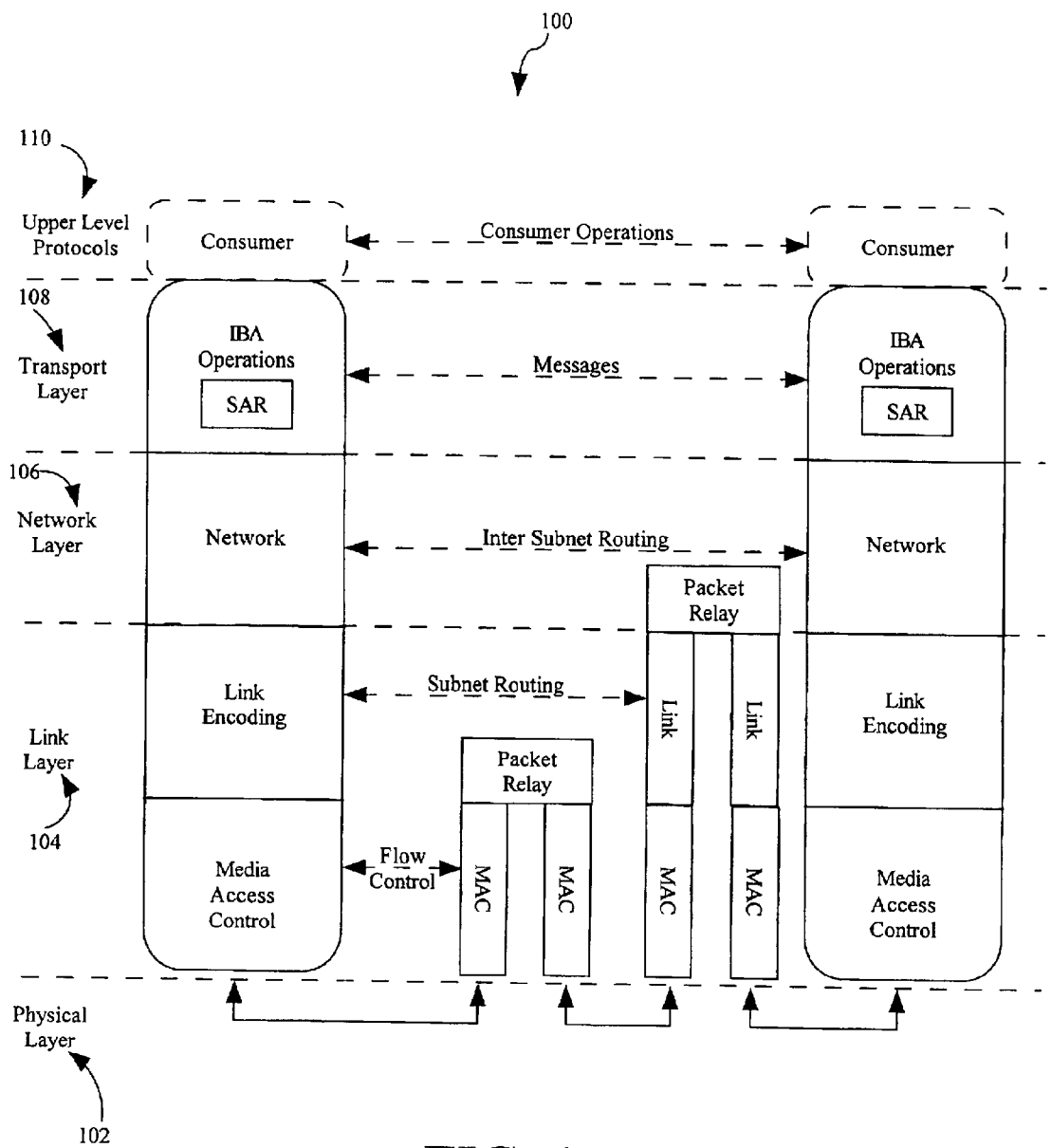
FIG. 1 is a block diagram of the InfiniBand architecture layers.
Figure 2:
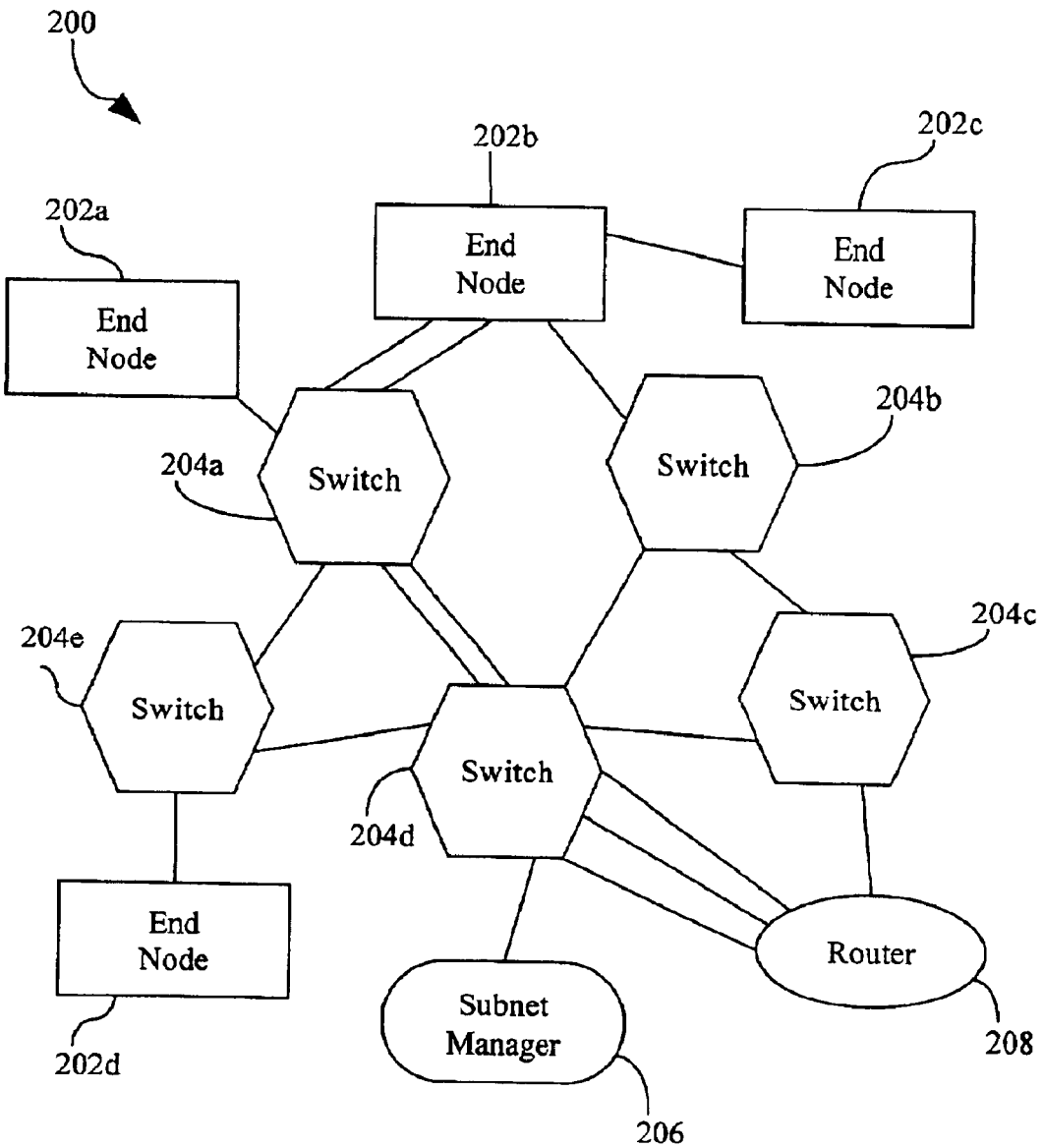
FIG. 2 is a block diagram of an InfiniBand subnet.

Reference will now be made in detail to the present invention, examples of which are illustrated in the accompanying drawings, wherein like reference numerals refer to like elements throughout.

In general, the present invention relates to apparatus and method steps embodied in software and associated hardware including computer readable medium, configured to store and/or process electrical or other physical signals to generate other desired signals. In general, the method steps require physical manipulation of data representing physical quantities. Usually, though not necessarily, such data takes the form of electrical or magnetic signals capable of being stored, transferred, combined, compared or otherwise manipulated. Those of ordinary skill in the art conveniently refer to these signals as "bits", "values", "elements", "symbols", "characters", "images", "terms", "numbers", or the like. It should be recognized that these and similar terms are to be associated with the appropriate physical quantities they represent and are merely convenient labels applied to such quantities.

Accordingly, the detailed description which follows contains descriptions of methods presented in terms of methods that are described using symbolic representations of data transfixed in a computer readable medium such as RAM, ROM, CR-ROM, DVD, hard disk, floppy disk, data communication channels such as USB, SCSI, or FIREWIRE and/or a network such as IBA, the Internet, or a LAN. These descriptions and representations are the means used by those skilled in the art effectively convey the substance of their work to others skilled in the art.

The term data processing device encompasses any of a variety of devices that are responsive to data and either perform some operation in response to the receipt thereof or modify the data in accordance with internal or external instructions that may be stored separately from the data processing devices or encoded into the structure of the data processing device. The term "method" is generally used to refer to a series of operations performed by a data processing device and, as such, encompasses such terms of art as "routine," "software," "program," "objects," "functions," "subroutines," and "procedures."

Unless otherwise noted, the methods recited herein may be enabled in one or more integrated circuits configured to perform the method steps taught herein. The required functional structures for such circuits appear in the description given below. Data processing devices that may be configured to perform the functions of the present invention include those manufactured by such companies as AGILENT and CISCO as well as other manufacturers of networking devices.

Figure 6:
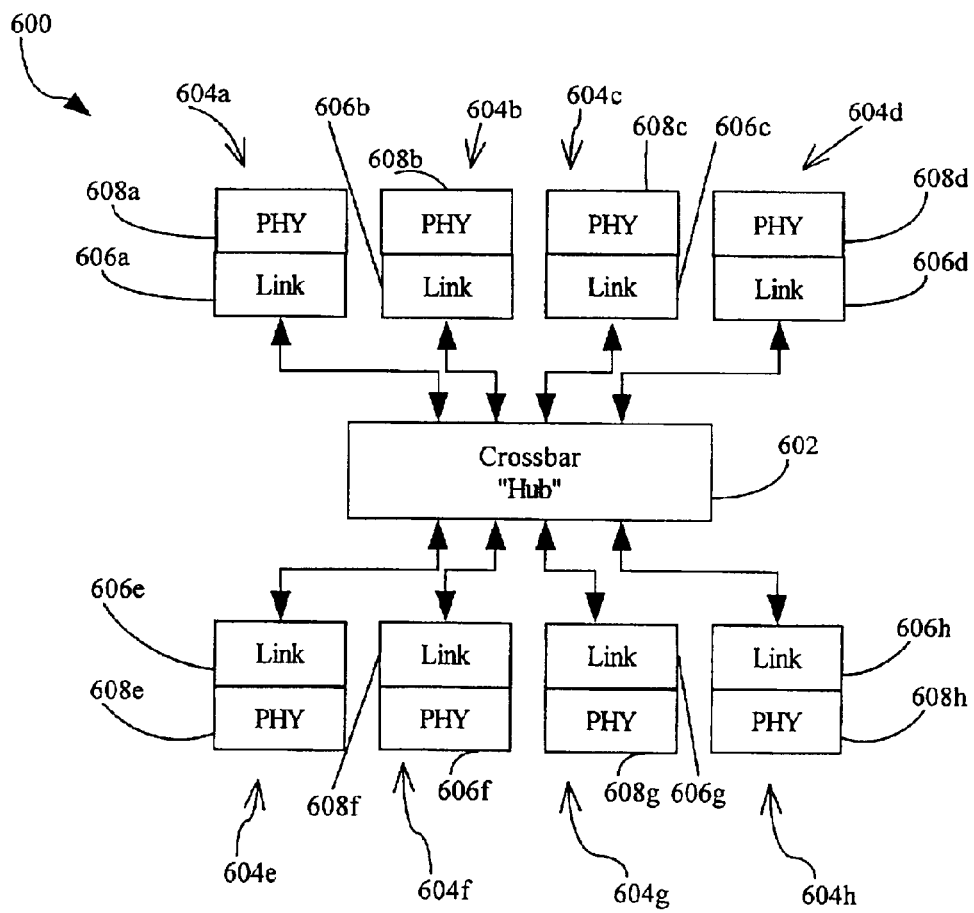
FIG. 6 is a block diagram of an InfiniBand switch in accordance with a preferred embodiment of the present invention.

FIG. 6 is a conceptual block diagram of a switch 600 in accordance with the preferred embodiment of the present invention. It will be appreciated by those of ordinary skill in the relevant arts that the switch 600, as illustrated in FIG. 6, and the operation thereof as described hereinafter is intended to be generally representative of such systems and that any particular switch may differ significantly from that shown in FIG. 6, particularly in the details of construction and operation. As such, the switch 600 is to be regarded as illustrative and exemplary and not limiting as regards the invention described herein or the claims attached hereto.

The switch 600 generally comprises a crossbar 602 (also referred to as a "hub") to which a plurality of ports 602a through 602h are connected. Each port 602 of the switch 600 generally comprises a link block 606 and a physical block 608 ("PHY"). In perhaps the preferred embodiment the crossbar 602 is a ten port device with two ports being reserved for management functions. FIG. 6 only portrays eight ports 602a through 602h for clarity of presentation.

The PHY block 608 primarily serves as a serialize to de-serialize ("SerDes") device. The link block 406 performs several functions, including the input buffer, receive ("RX"), transmit ("TX"), and flow control. The input virtual lanes (VLs) are physically contained in input buffers (not shown) of the link block 606. Other functions that may be performed by the link block 606 include: integrity checking, link state and status, error detecting and recording, flow control generation, and output buffering.

The crossbar 602 is preferably implemented as a sparsely populated data path structure. In essence, the crossbar 602 acts as a distributed MUX for every possible input to each output port. The crossbar 602 is preferably combinatorial, and capable of completing the switching process for one 32-bit word within one 250 MHz system clock period (4.0 ns).

Figure 4:
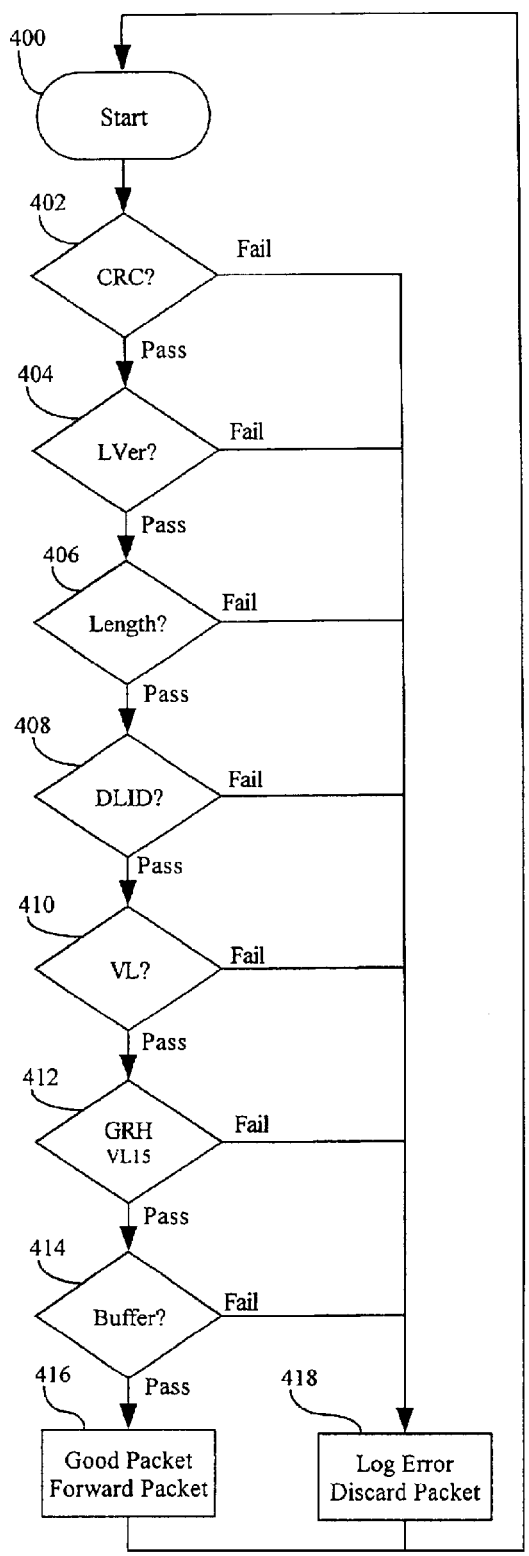
FIG. 4 is a flow chart of the operation of a data packet check machine as described in the IBA specification.
Figure 5:
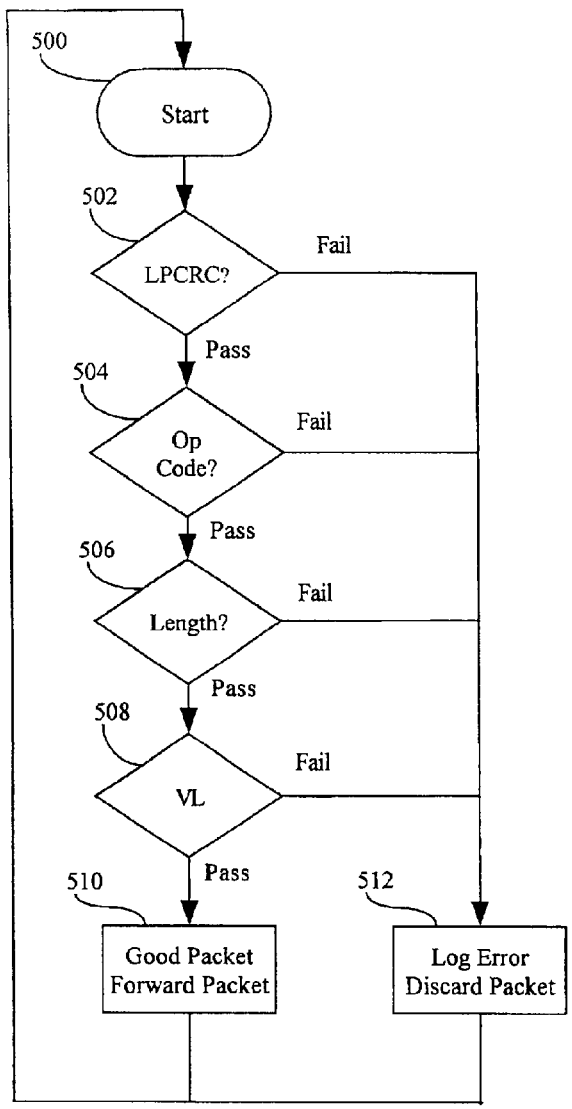
FIG. 5 is a flow chart of the operation of a link packet check machine as described in the IBA specification.
Figure 7:
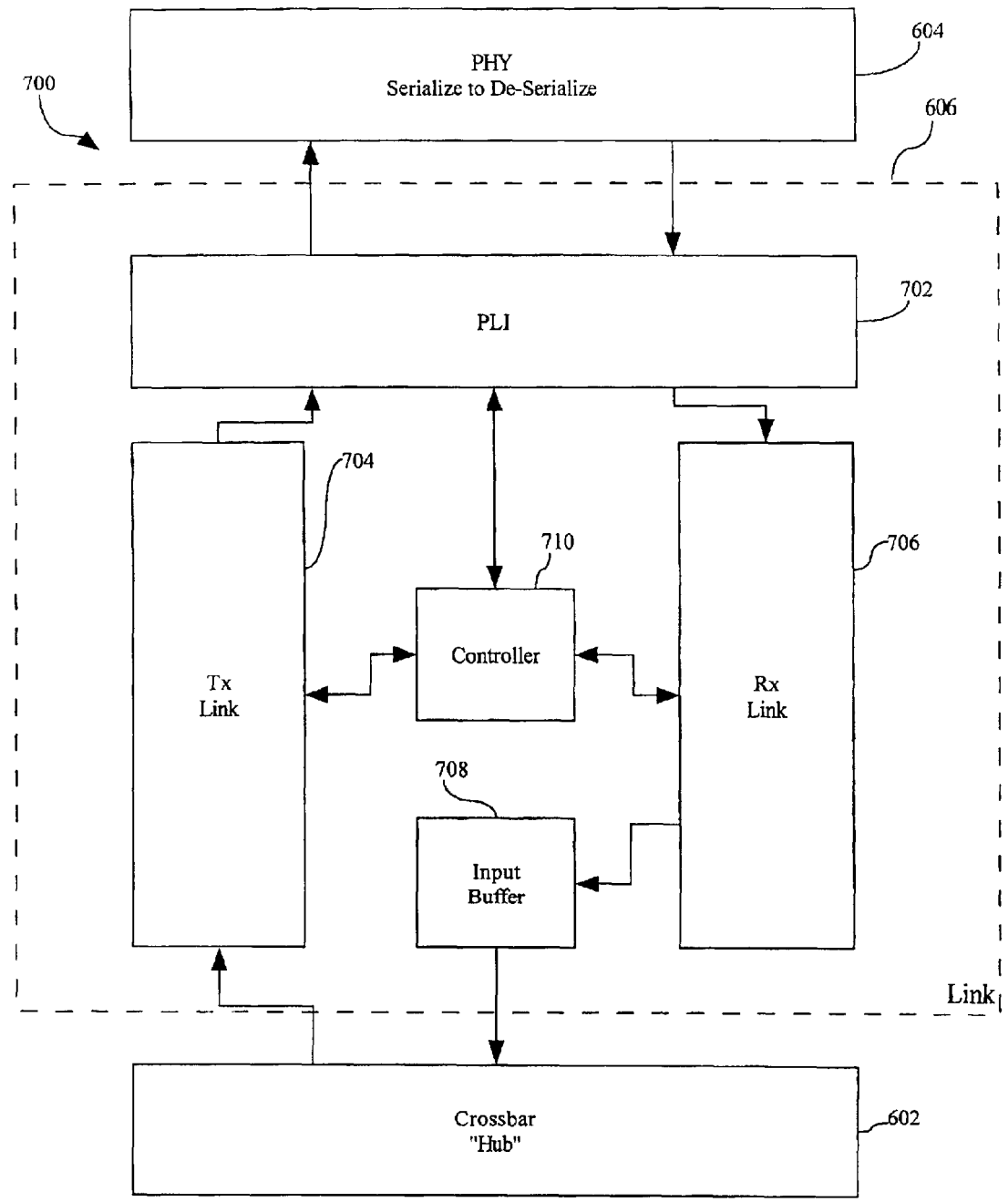
FIG. 7 is a block diagram of an InfiniBand switch in accordance with a preferred embodiment of the present invention.

FIG. 7 is a block diagram of an InfiniBand switch 700 in accordance with a preferred embodiment of the present invention. More specifically, FIG. 7 is a more detailed view of the switch 600 shown in FIG. 4 providing more detail of the link block 606. It will be appreciated by those of ordinary skill in the relevant arts that the switch 700, as illustrated in FIG. 7, and the operation thereof as described hereinafter is intended to be generally representative of such systems and that any particular switch may differ significantly from that shown in FIG. 7, particularly in the details of construction and operation. Further, only those functional elements that have bearing on the present invention have been portrayed so as to focus attention on the salient features of the inventive features. As such, the switch 700 is to be regarded as illustrative and exemplary and not limiting as regards the invention described herein or the claims attached hereto.

The link block 606 generally comprises a phy-link interface 702 (the "PLI") connected to a transmit link 704 (the "Tx Link") and a receive link (the "Rx Link") 706. The Rx link 706 outputs to input buffer 708 for transfer of data to the crossbar 702. A controller 710, primarily comprising registers, controls the operation of the transmit and receive links 704 and 706.

The PLI 702 connects transmitter and receiver portions of the PHY block 604 to the link block 606's Tx Link 704 and Rx Link 706. The receive portion of the PLI 702 realigns the data from the PHY block 604 and detects special characters and strings of characters, such as a start of packet (SOP) indicator, from the received data stream.

The Rx Link 706 accepts packet data from the PLI 702, performs combinational error checking in accordance with the preferred embodiment of the present invention, and upon successful completion of the checks passes the data on to a the input buffer 708 for transfer to the crossbar 602. The Tx Link 704 sends data packets that are ready to transfer from the Hub 602 to the PHY block 604, through the PLI 702. In doing so, the Tx Link 704 realigns the data, adds the placeholder for the start/end packet control characters, and calculates and inserts the VCRC field. In addition to data packets, the Tx Link 504 also accepts and transmits flow control link packets from a flow control state machine (not shown).

Figure 3:
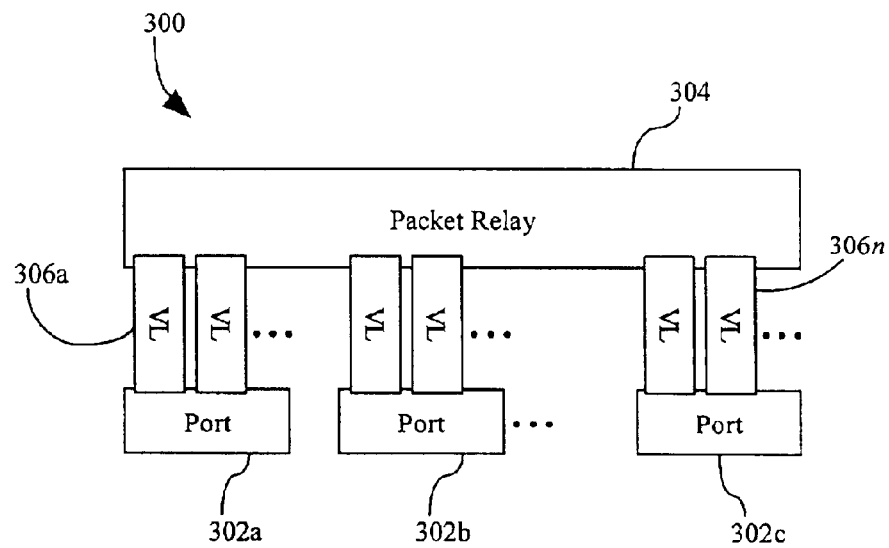
FIG. 3 is a block diagram of an InfiniBand switch.
Figure 8:
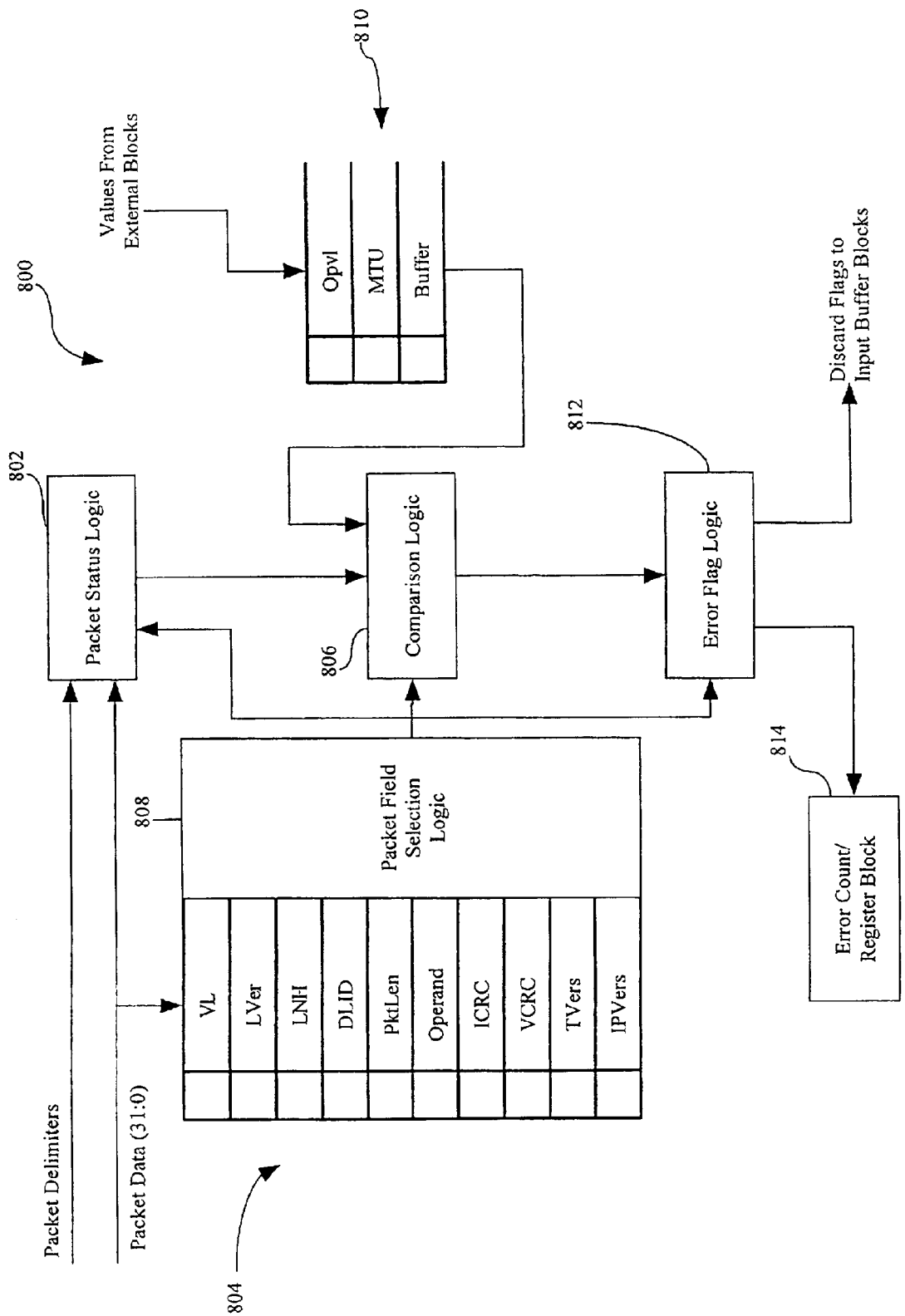
FIG. 8 is a block diagram of combinational error circuitry in an InfiniBand switch in accordance with a preferred embodiment of the present invention.

FIG. 8 is a block diagram of combinational error circuitry 800 in an InfiniBand switch in accordance with a preferred embodiment of the present invention. FIG. 3 also serves to describe the data flow in the present invention thereby, illuminating a preferred method of the present invention. The combinational checks are initiated when a start of packet delimiter is received by the packet status logic 802. Either a start of link packet or the start of a data packet will initiate combinational checks in accordance with a preferred embodiment of the present invention. The packet status logic 802 keeps track of the packet type, word count, and start/end delimiters.

Once a start of packet delimiter is received, packet data will begin to arrive in the form of 32-bit words. Fields that are required for the combinational checks are stored in packet field registers 804. In FIG. 8, several such registers are portrayed, e.g. VL (virtual lane: 0–7), LVER (link layer version), LNH (link next header—used for GRH VL 15 check), DLID (destination LIP), PktLen (packet length), Operand (a link packet check field), ICRC (cyclic redundancy check), VCRC, TVer (transport layer version), and IPVers (IP version). As noted above the fields that are required to be checked are well defined by the IBA Specification, however, the present invention facilitates additional checks not mandated by the IBA Specification, such as the TVER and IPVERs. The fields to be striped are preferably identified by simple bit/word counting.

At the appropriate points in the data stream the comparison logic 806 performs a comparison between the values stored in the registers 804 and comparison values. The appropriate point to perform each comparison may be made based on, for example: the word count maintained by the packet status logic 802; the entry of data into the appropriate registers; or data sent by other blocks, such as an end of packet indication from the packet status logic 802. Packet field selection logic 808 controls the read and write enables to and from the registers 804, preferably based on packet word counts.

The comparison values may be either IBA specified values or derived values. An example of a IBA specified value is LVER (link layer version). An example of a derived value is the packet length that is calculated by the packet status logic counting the length of the packet as it arrives. Certain values needed for the comparisons performed by the comparison logic 806 may be stored in registers 810. In the example shown in FIG. 8, OpVl (Operational Virtual Lanes indicating the number of virtual lanes on the port), MTU (maximum transfer unit) and buffer space are shown. In general these values are supplied from functional blocks external to the combinational error circuitry 800.

When the comparison logic 806 determines the presence of an error state, an error flag is set in error flag logic 812. The error flag logic 812 accumulates any and all error flags set by the comparison logic 806 until a n end of packet delimiter is received from the packet status logic 802. It is to be noted that it may prove more efficient for the packet delimiters to be passed to the error flag logic indirectly, such as through the packet field selection logic 808. Once an end of packet delimiter has been received and all checks have been performed, a full set of error flags is then sent to the error count/register block 814. The error count/register block 814 prioritizes the error flags based on the IBA specification.

The errors are also transmitted to the input buffer 708 (see FIG. 7). If the errors occur early in the packet transmission, while the entirety of the received packet is still in the input buffer 708, the input buffer 708 can simply discard the packet. If the packet has an error but cannot be discarded, the packet is truncated (shortened) by the input buffer 708, and marked as a bad packet.

The present invention enables error checking to be performed without requiring storage of an entire packet. Further, the present invention performs error checking during packet reception. Finally, the present invention enables maintains error precedence as required by the IBA specification.

Although an embodiment of the present invention has been shown and described, it will be appreciated by those skilled in the art that changes may be made in such embodiment without departing from the principles and spirit of the invention, the scope of which is defined in the claims and their equivalents.

What is claimed is:

1. A combination error detector to detect errors in an InfiniBand packet, the detector comprising:

a register that stores fields of an InfiniBand packet as the packet is being received; and comparison logic that, as the fields are stored in the register, compares the fields with check values and when an error is detected sets a flag corresponding to the error.

2. The combinational error detector, as set forth in claim 1, further comprising:

packet status logic that identifies the start of a packet and counts the words received in the packet; and wherein the fields to be stored in the register are determined based on the start of the packet and the word count as identified by the packet status logic.

3. The combinational error detector, as set forth in claim 1, further comprising:

an error flag handler that stores the flags set for each packet and upon completion of the comparisons by the comparison logic prioritizes the flags based on the InfiniBand Architecture Specification.

4. The combinational error detector, as set forth in claim 1, further comprising:

a second register that stores values to be compared with the fields in the register by the comparison logic.

5. The combinational error detector, as set forth in claim 1, further comprising:

an error flag handler that outputs an indication that the packet should be discarded or truncated when a predetermined error flag is set by the comparison logic.

6. An InfiniBand switch comprising:

a hub that redirects incoming packets;

a port that receives incoming packets, performs concurrent combinational error detection on the incoming packets and discards those packets that have a predetermined error.

7. The InfiniBand switch, as set forth in claim 6, wherein the port comprises:

a combination error detector to detect errors in an InfiniBand packet, the detector including:

a register that stores fields of an InfiniBand packet as the packet is being received; and comparison logic that, as the fields are stored in the register, compares the fields with check values and when an error is detected sets a flag corresponding to the error.

8. The InfiniBand switch, as set forth in claim 7, wherein the combinational error detector further comprises:

packet status logic that identifies the start of a packet and counts the words received in the packet; and wherein the fields to be stored in the register are determined based on the start of the packet and the word count as identified by the packet status logic.

9. The InfiniBand switch, as set forth in claim 7, wherein the combinational error detector further comprises:

an error flag handler that stores the flags set for each packet and upon completion of the comparisons by the comparison logic prioritizes the flags based on the InfiniBand Architecture Specification.

10. The InfiniBand switch, as set forth in claim 7, wherein the combinational error detector further comprises:

a second register that stores values to be compared with the fields in the register by the comparison logic.

11. The InfiniBand switch, as set forth in claim 7, wherein the combinational error detector further comprises:

an error flag handler that outputs a indication that the packet should be discarded or truncated when a predetermined error flag is set by the comparison logic.

* * * * *